(12) United States Patent
Sundararajan et al.

(10) Patent No.: US 8,650,517 B1
(45) Date of Patent: Feb. 11, 2014

(54) AUTOMATICALLY DOCUMENTING CIRCUIT DESIGNS

(75) Inventors: Arvind Sundararajan, Sunnyvale, CA (US); Nabeel Shirazi, Saratoga, CA (US); Jingzhao Ou, San Jose, CA (US); Chi Bun Chan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 726 days.

(21) Appl. No.: 12/581,631

(22) Filed: Oct. 19, 2009

(51) Int. Cl.
*G06F 17/50* (2006.01)

(52) U.S. Cl.
USPC ............................ 716/104; 716/101; 716/139

(58) Field of Classification Search
USPC ................................................ 716/101, 104
See application file for complete search history.

(56) References Cited

U.S. PATENT DOCUMENTS

| | | | | |
|---|---|---|---|---|
| 7,007,261 | B1 * | 2/2006 | Ballagh et al. | 716/103 |
| 8,122,399 | B2 * | 2/2012 | Bowers et al. | 716/104 |
| 8,201,137 | B1 * | 6/2012 | Bhushan et al. | 716/139 |

OTHER PUBLICATIONS

Van Heesch, Dimitri, *Doxygen Manual for* v1.5.6, May 18, 2008, pp. 11-50, downloaded and printed Oct. 16, 2009 from <ftp://ftp.stack.nl/pub/users/dimitri>.
Xilinx, Inc., *System Generator for DSP*, Rel. 10.1, Mar. 2008, pp. 87-92, Xilinx, Inc., San Jose, California, USA.

* cited by examiner

*Primary Examiner* — Thuan Do
(74) *Attorney, Agent, or Firm* — Kevin T. Cuenot; LeRoy D. Maunu (57) ABSTRACT

Within a system comprising a processor and a memory, a method of automatically documenting a circuit design can include determining an assignment of a user comment entity (UCE) of a high level modeling system (HLMS) circuit design to an HLMS block of the HLMS circuit design, translating each HLMS block of the HLMS circuit design into a hardware description language (HDL) representation of the HLMS block, and for each HLMS block assigned a UCE, inserting within the HDL representation, by the processor, content of the UCE that is assigned to the HLMS block in the form of a comment. The HDL representations can be stored within the memory.

20 Claims, 5 Drawing Sheets

AUTOMATICALLY DOCUMENTING CIRCUIT DESIGNS

FIELD OF THE INVENTION

The embodiments disclosed within this specification relate to integrated circuit devices (ICs). More particularly, the embodiments relate to generating documentation from a high level modeling system circuit design for implementation within an IC.

BACKGROUND

A High-Level Modeling System (HLMS) refers to a computer-based circuit design tool that allows circuit designers to create circuits at a high level of abstraction. Typically, an HLMS provides a graphic design environment within which circuit designers create circuit designs using a "drag-and-drop" design paradigm. A circuit designer can drag graphic blocks into the design environment. Each graphic block represents a particular circuit function. For example, each graphic block can represent a function such as multiplexing, addition, multiplication, filtering, or the like. Within the design environment, the circuit designer also can specify connectivity and signal flows among the graphic blocks by drawing lines that interconnect the various blocks.

One example of an HLMS is Xilinx System Generator for Digital Signal Processing (DSP), also known as "SysGen." SysGen is a high-performance, computer-based design tool that executes as part of Simulink to provide a high-level, graphical modeling environment. Simulink runs in Matlab from The MathWorks, Inc., of Natick, Mass. and is an interactive tool for modeling, simulating, and analyzing dynamical systems.

Circuit designers are permitted to add comments to a circuit design within the HLMS design environment. The comments provide descriptive information relating to the various parts of the HLMS circuit design. At some point in the development process, the HLMS circuit design is transformed into hardware description language for further processing and ultimately implementation within an IC. The resulting HDL is devoid of commentary and other information from the HLMS circuit design. As such, attempting to correlate different portions of HDL to the blocks of the HLMS circuit design can be difficult. The lack of explanatory information also complicates further design efforts directed to the HDL itself.

SUMMARY

The embodiments disclosed within this specification relate to integrated circuit devices (ICs) and, more particularly, to automatically generating documentation for a circuit design for implementation within an IC. One embodiment of the present invention can include a method of automatically documenting a circuit design that can be implemented within a system comprising a processor and a memory.

The method can include determining an assignment of a user comment entity of a high level modeling system (HLMS) circuit design to an HLMS block of the HLMS circuit design and translating each HLMS block of the HLMS circuit design into a hardware description language representation of the HLMS block. For each HLMS block assigned a user comment entity, the processor can insert, within the hardware description language representation, content of the user comment entity that is assigned to the HLMS block in the form of a comment. The hardware description language representations of the HLMS blocks can be stored in memory.

In one aspect, determining an assignment of a user comment entity can include assigning a selected user comment entity to each HLMS block within a predetermined distance of the selected user comment entity or assigning a selected user comment entity to each HLMS block having a block name matching a portion of text of the selected user comment entity.

In another aspect, determining an assignment of a user comment entity can include, for a selected user comment entity, determining a candidate set comprising each HLMS block within a predetermined distance of the selected user comment entity, removing each HLMS block from the candidate set that does not have a block name matching a portion of text of the selected user comment entity, and assigning the selected user comment entity to each HLMS block of the candidate set.

In another aspect, determining an assignment of a user comment entity can include, for a selected user comment entity, determining a candidate set comprising each HLMS block having a block name matching a portion of text of the selected user comment entity, removing each HLMS block from the candidate set that is not within a predetermined distance of the selected user comment entity, and assigning the selected user comment entity to each HLMS block of the candidate set.

Determining an assignment of a user comment entity also can include assigning a selected user comment entity to a selected HLMS block responsive to a received user input indicating that the selected user comment entity is assigned to the selected HLMS block.

The method also can include determining an assignment of a selected user comment entity of the HLMS circuit design to an HLMS shared memory block of the HLMS circuit design and generating source code specifying a software driver that is executable by an embedded processor configured to communicate with a circuit specified by the hardware description language representations of the HLMS blocks. Within the source code, content of the selected user comment entity of the HLMS circuit design can be inserted in the form of at least one comment.

Another embodiment of the present invention can include a method of automatically documenting a circuit design. The method can be implemented within a system comprising a processor and a memory. The method can include determining an assignment of a user comment entity of an HLMS circuit design to an HLMS shared memory block of the HLMS circuit design and generating source code, by the processor, specifying a software driver that is executable by an embedded processor configured to communicate with a circuit specified by the HLMS circuit design. The method further can include inserting, by the processor, content of the at least one user comment entity assigned to the HLMS shared memory block within the source code as a comment and storing, within the memory, the software driver comprising the comment.

In one aspect, determining an assignment of a user comment entity can include assigning a selected user comment entity to the HLMS shared memory block responsive to a received user input indicating that the selected user comment entity is assigned to the HLMS shared memory block or assigning each user comment entity within a predetermined distance of the HLMS shared memory block to the HLMS shared memory block.

In another aspect, determining an assignment of a user comment entity can include assigning each user comment entity comprising text matching a block name of the HLMS shared memory block to the HLMS shared memory block. In still another aspect, the user comment entity assigned to the HLMS shared memory block can be assigned only to the HLMS shared memory block and to no other HLMS block.

Documentation for the software driver can be automatically generated by extracting at least a portion of the comments from the software driver and inserting the extracted comments within a documentation file exclusive of the source code.

The method also can include determining an assignment of at least one additional user comment entity of the HLMS circuit design to an HLMS block of the HLMS circuit design, translating each HLMS block of the HLMS circuit design into a hardware description language representation of the HLMS block, and, for each HLMS block assigned a user comment entity, inserting within the hardware description language representation, by the processor, content of the user comment entity associated with the HLMS block in the form of a comment.

Another embodiment of the present invention can include a device comprising a data storage medium usable by a system comprising a processor and a memory. The data storage medium can store program code that, when executed by the system, causes the system to execute operations comprising determining an assignment of a user comment entity of an HLMS circuit design to an HLMS block of the HLMS circuit design, translating each HLMS block of the HLMS circuit design into a hardware description language representation of the HLMS block, and, for each HLMS block assigned a user comment entity, inserting within the hardware description language representation, by the processor, content of the user comment entity that is assigned to the HLMS block in the form of a comment. The hardware description language representations of the HLMS blocks can be stored in memory.

In one aspect, determining an assignment of a user comment entity can include assigning a selected user comment entity to each HLMS block within a predetermined distance of the selected user comment entity and assigning a selected user comment entity to each HLMS block having a block name matching a portion of text of the selected user comment entity.

Determining an assignment of a user comment entity also can include, for a selected user comment entity, determining a candidate set comprising each HLMS block determined according to a first user comment entity association technique, removing each HLMS block from the candidate set identified according to a second user comment entity association technique, and assigning the selected user comment entity to each HLMS block of the candidate set.

Determining an assignment of a user comment entity can include assigning a selected user comment entity to a selected HLMS block responsive to a received user input indicating that the selected user comment entity is assigned to the selected HLMS block.

The data storage medium further can store program code that, when executed by the system, causes the system to execute operations comprising determining an assignment of a selected user comment entity of the HLMS circuit design to an HLMS shared memory block of the HLMS circuit design, generating source code specifying a software driver that is executable by an embedded processor configured to communicate with a circuit specified by the hardware description language representations of the HLMS blocks, and inserting, within the source code, content of the selected user comment entity of the HLMS circuit design in the form of at least one comment.

DETAILED DESCRIPTION

While the specification concludes with claims defining the features of the embodiments of the invention that are regarded as novel, it is believed that the inventive arrangements disclosed herein will be better understood from a consideration of the description in conjunction with the drawings. As required, detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the embodiments of the invention in virtually any appropriately detailed structure. Further, the terms and phrases used herein are not intended to be limiting, but rather to provide an understandable description of the embodiments of the invention.

The embodiment disclosed within this specification relate to integrated circuit devices (ICs). More particularly, the embodiments relate to preserving user comments from a circuit design specified within a high level modeling system (HLMS). The user comments specified within the HLMS circuit design can be identified and inserted into a programmatic description of the system, or a portion thereof, that is generated from the HLMS circuit design. For example, the user comments from the HLMS circuit design can be included within a version of the circuit design specified in a hardware description language (HDL). In another example, the user comments from the HLMS circuit design can be included within source code that is derived from the HLMS circuit design.

Figure 1:
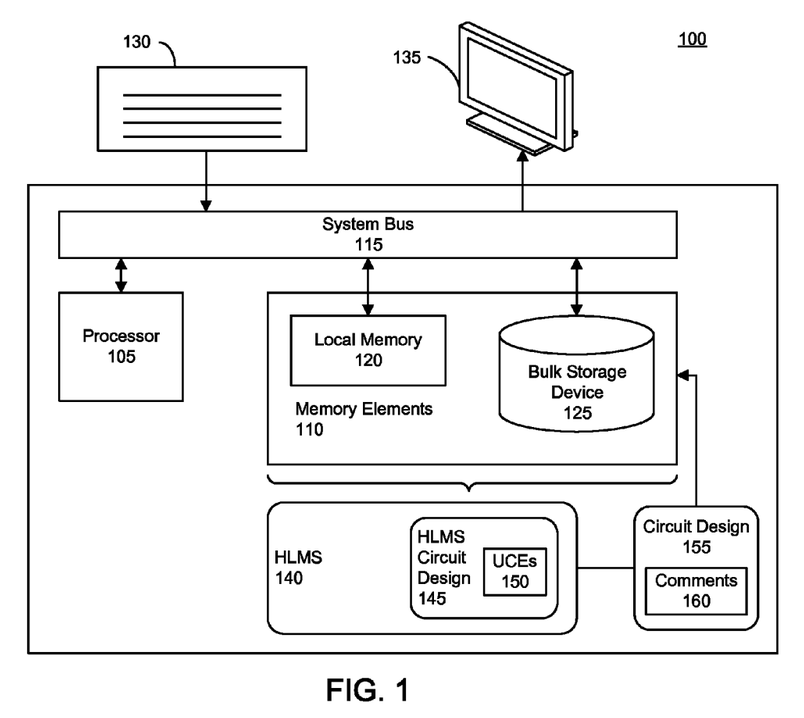
FIG. 1 is a first block diagram illustrating a system for automatically documenting a circuit design in accordance with one embodiment of the present invention.

FIG. 1 is a first block diagram illustrating a system 100 for automatically documenting a circuit design in accordance with one embodiment of the present invention. In one aspect, system 100 can generate one or more circuit designs for instantiation within, or implementation as, an IC. The circuit designs that are generated can be implemented within an IC, whether the IC is a programmable IC or not.

Programmable ICs are a well-known type of IC that can be programmed to perform specified functions. Examples of programmable ICs can include, but are not limited to, field programmable gate arrays (FPGAs), complex programmable logic devices (CPLDs), and mask programmable devices. The phrase "programmable IC" refers to the ICs noted herein and ICs that are only partially programmable. For example, another type of programmable IC includes a combination of hard-coded transistor logic and a programmable switch fabric that programmably interconnects the hard-coded transistor logic.

System 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

As pictured in FIG. 1, memory elements 110 can store an HLMS 140. HLMS 140, being implemented in the form of executable program code, can be executed by system 100. HLMS 140 provides a graphic design environment within which circuit designers create circuit designs, referred to as HLMS circuit designs, using a "drag-and-drop" design paradigm. A circuit designer can drag graphic blocks, referred to as HLMS blocks, into the design environment. Each HLMS block represents a particular circuit function. For example, each HLMS block can represent a function such as multiplexing, addition, multiplication, filtering, or the like. Within the design environment, the circuit designer also can specify connectivity and signal flows among the HLMS blocks by drawing lines that interconnect the various HLMS blocks.

HLMS 140 can transform an HLMS circuit design, such as HLMS circuit design 145, into circuit design 155. Circuit design 155 can be output to memory elements 110. As used herein, "outputting" and/or "output" can mean storing in memory elements 110, for example, writing to a file stored in memory elements 110, writing to display 135 or other peripheral output device, playing audible notifications, sending or transmitting to another system, exporting, or the like.

Circuit design 155 can be specified in programmatic form. In one embodiment, circuit design 155 can be specified in an HDL. In another embodiment, circuit design 155 can be specified, at least in part, in the form of source code in a high level programming language such as C, C+, or the like. Still, circuit design 155 can be specified as a combination of HDL and a high level programming language.

As shown, HLMS circuit design 145 can include one or more "user comment entities" (UCEs) 150. A "UCE," as used within this specification, refers to text, e.g., letters, numbers, symbols, etc., specified by an HLMS circuit design within the design environment provided by an HLMS. Typically, a UCE includes user-specified text that provides explanation of some aspect or functionality of the HLMS circuit design. The UCEs do not specify functionality or other aspects of hardware design. HLMS 140 does not infer connectivity or functionality from UCEs. Rather, UCEs provide humans with explanation of some aspect of HLMS circuit design 145. Several different types of UCEs exist, which will be described within this specification in greater detail.

In translating HLMS circuit design 145 into circuit design 155, system 100 identifies UCEs 150 and incorporates the content of UCEs 150 into circuit design 155 in the form of comments. For example, the content of UCEs can be inserted into the HDL of circuit design 155 in the form of comments or inserted into high level programming language source code of circuit design 155 in the form of comments.

A "comment," when used in reference to HDL, a high level language, or the like, is intended to refer to text that is not processed by a compiler. Thus, referring to HDL, comments 160 do not specify hardware and, thus, are not transformed into hardware. Referring to high level programming language source code, comments 160 are not compiled into executable program code. Comments provide explanation that documents aspects of circuit design 155.

Figure 2:
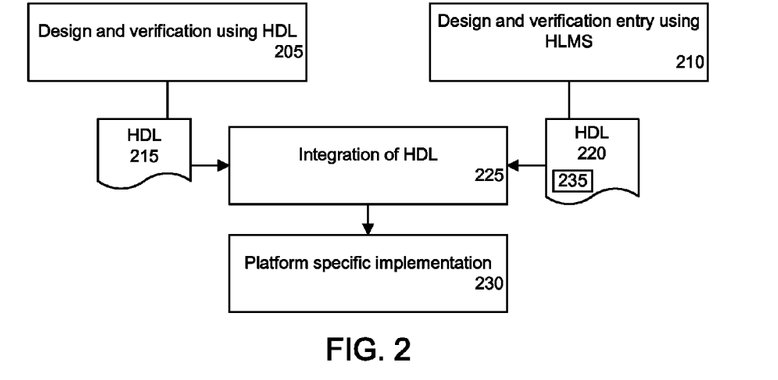
FIG. 2 is a block flow diagram illustrating a method of circuit design in accordance with another embodiment of the present invention.

FIG. 2 is a block flow diagram illustrating a method of circuit design in accordance with another embodiment of the present invention. FIG. 2 illustrates a situation in which HDL from multiple sources is combined to form a larger circuit design. FIG. 2 illustrates the case where a system comprising an HLMS is used to design a particular part of a larger circuit design. For example, the HLMS circuit design can be a subsystem of the larger circuit design. The resulting HDL from the system must be combined with the other portions of the circuit design.

Step 205 represents a design and verification process for a circuit into which another circuit, e.g., one specified by an HLMS circuit design, is to be integrated. The result of step 205 is HDL 215. Step 210 illustrates a design and verification process for a particular subsystem, e.g., an HLMS circuit design, being developed using a system, for example, as described with reference to FIG. 1. HDL 220, being output from the system, specifies the circuit or subsystem to be incorporated into the circuit specified by HDL 215. As shown, HDL 220 includes one or more comments 235 that were derived from UCEs initially defined within the HLMS as part of the HLMS circuit design.

In step 225, HDL 215 and HDL 220 can be integrated into a larger, unified circuit design. For example, the subsystem specified by HDL 220 can be integrated into HDL 215. In step 230, further processing can be performed to synthesize the combined HDL into hardware. Step 230 represents various processing tasks that are platform specific, e.g., specific to a particular target IC within which the circuit design specified by the combined HDL will be implemented.

Figure 3:
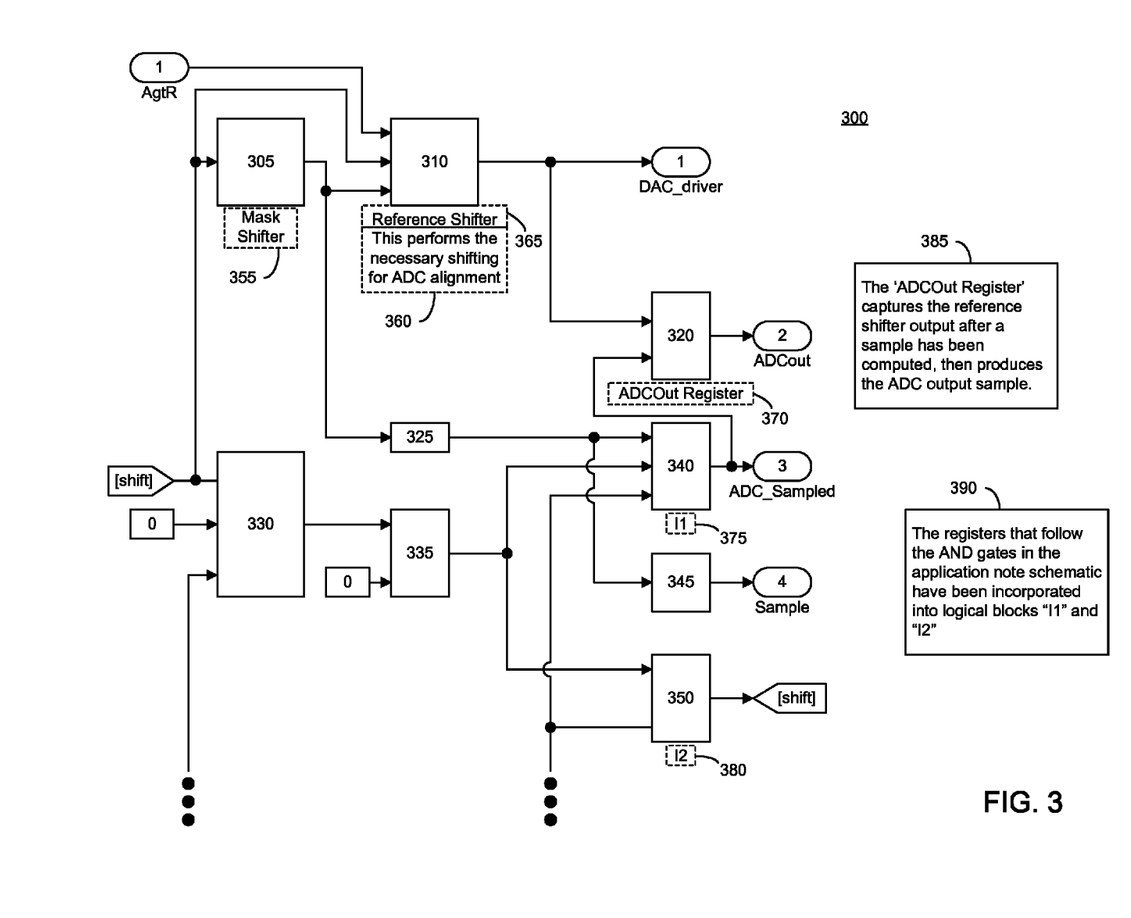
FIG. 3 is a second block diagram illustrating a high level modeling system circuit design in accordance with another embodiment of the present invention.

FIG. 3 is a second block diagram illustrating an HLMS circuit design 300 in accordance with another embodiment of the present invention. The view presented within FIG. 3 of HLMS circuit design 300 can be one that is displayed to a circuit designer by system 100 as described with reference to FIG. 1. As shown, HLMS circuit design 300 includes a plurality of HLMS blocks 305, 310, 320, 325, 330, 335, 340, 345, and 350. HLMS circuit design 300 further includes a plurality of UCEs 355, 360, 365, 370, 375, 380, 385, and 390.

FIG. 3 illustrates several different types of UCEs. UCEs 355, 365, 370, 375, and 380 illustrate "block name" type UCEs. Each block name, upon creation, is directly associated with, and therefore, assigned to, a particular HLMS block. Thus, each block name serves as a reference or handle for accessing the HLMS block associated with that block name. For example, upon dragging an HLMS block such as HLMS block 305 into the graphical design environment, the circuit designer can assign a block name to HLMS block 305.

In general, the block name for each HLMS block, if specified, can be displayed immediately beneath the HLMS block. Thus, HLMS block 305 is named "Mask Shifter" according to UCE 355. HLMS block 310 is named "Reference Shifter" according to UCE 365. HLMS block 320 is named "ADCOut Register" according to UCE 370. HLMS block 350 is named "I1" according to UCE 375. HLMS block 350 is named "I2" according to UCE 380.

UCE 360 illustrates a "tag" type of UCE. A tag, like a block name, is directly assigned to, or associated with, a particular HLMS block, e.g., HLMS block 310, by the circuit designer upon creation. Whereas the block name type of UCE provides a text label for referencing a particular HLMS block, the tag type of UCE provides more explanatory information relating to the HLMS block. Tag type UCEs can be created and assigned to a particular HLMS block responsive to a user request to do so.

UCEs 385 and 390 illustrate "text block" types of UCEs. Text block UCEs provide further explanatory information. A circuit designer can insert a text block within HLMS circuit design 300 to convey further detail regarding the workings of HLMS circuit design 300, or various portions thereof. Unlike block name and tag type UCEs, however, text blocks are not directly associated with any particular HLMS block. Rather, the circuit designer creates each text block for general description. Upon creation, the text blocks are not associated with any particular HLMS block, but rather are considered to be part of HLMS circuit design 300 as a whole. The content of a text block, however, can pertain to one HLMS block or a plurality of different HLMS blocks.

Because UCEs 385 and 390 are not associated with any HLMS block upon creation, the HLMS, when beginning the process of netlisting HLMS circuit design 300, can determine one or more HLMS blocks of HLMS circuit design 300 to which UCEs 385 and 390 are to be assigned using a selected UCE association technique. In one embodiment, distance can be used as the UCE association technique to identify particular HLMS blocks to which UCEs 385 and 390 are to be assigned. Selecting UCE 385 as an example, each HLMS block within a predetermined distance of UCE 385 can be selected. Distances can be measured between centroids or edges, for example, of HLMS blocks and UCEs. UCE 385 can be assigned to each selected HLMS block, e.g., each HLMS block within the predetermined distance of UCE 385. A similar process can be performed with respect to UCE 390. This technique can result in one UCE being assigned to more than one HLMS block of HLMS circuit design 300.

In another embodiment, the UCE association technique used to assign UCEs to HLMS blocks can be based upon contextual information relating to the HLMS blocks and the UCEs. For example, text matching can be used. The content of a UCE, e.g., particular words, letters, numbers, or symbols of UCE 385, can be identified. Since the content of UCE 385 includes the text corresponding to the block name "ADCOut Register," which is the block name (UCE 370) of HLMS block 320, UCE 385 can be assigned to HLMS block 320.

In similar fashion, the content of UCE 390 includes block names "I1" and "I2." UCE 390 includes the text of UCE 375 and UCE 380, which are block name type UCEs assigned to HLMS blocks 340 and 350 respectively. Accordingly, UCE 390 can be assigned to each of HLMS blocks 340 and 350, which are named "I1" and "I2" respectively.

In another embodiment, which will be described in greater detail herein, the system can utilize a UCE association technique that relies upon both distance and contextual information in combination to select particular HLMS blocks to which the UCEs are assigned.

Figure 4:
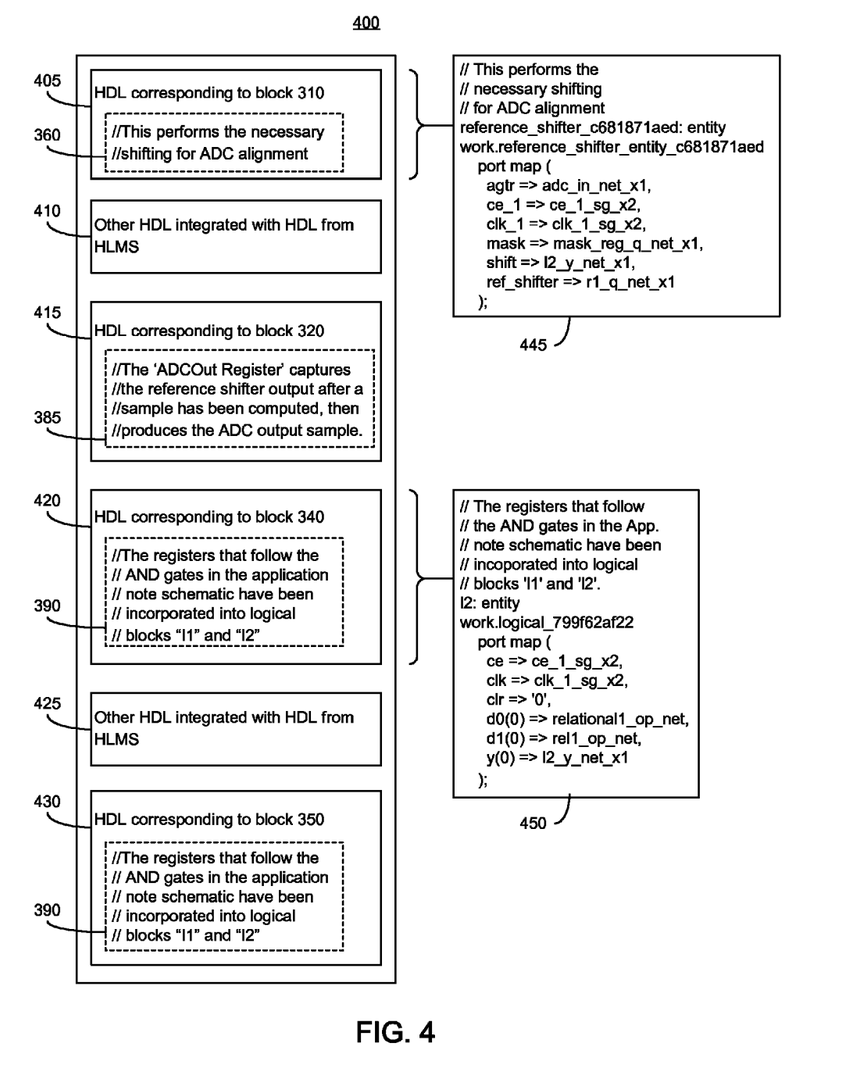
FIG. 4 is a third block diagram illustrating a netlist that has been generated in accordance with another embodiment of the present invention.

FIG. 4 is a third block diagram illustrating a netlist 400 that has been generated in accordance with another embodiment of the present invention. For purposes of illustration, netlist 400 is illustrated as being divided into a plurality of different HDL segments 405, 410, 415, 420, 425, and 430. HDL segments 410 and 425 illustrate portions of HDL that were designed and verified from one or more sources other than an HLMS, but have been integrated with HDL generated from HLMS circuit design 300 described with reference to FIG. 3. Accordingly, like numbers will be used to refer to the same items throughout this specification.

HDL segments 405, 415, 420, and 430 are portions of HDL the system has generated from HLMS blocks of HLMS circuit design 300. As shown, HDL segment 405 represents the portion of HDL generated by the system corresponding to HLMS block 310. Since UCE 360 is a tag type of UCE that is assigned to HLMS block 310, the system can incorporate the content of UCE 360 into any HDL that is generated to specify, or represent, HLMS block 310. Thus, within HDL segment 405, the system inserts the content from UCE 360 in the form of a comment. A more detailed example of HLD segment 405 comprising content from UCE 360 is illustrated in block 445.

In another embodiment (not shown), the content from block name type of UCEs can be incorporated into HDL segments. In illustration, UCE 365 of FIG. 3 is a block name type of UCE that is associated with HLMS block 310. Thus, the content of UCE 365 can be included within HDL segment 405 in the form of a comment. Inclusion of block names in the form of a comment within HDL can aid in correlating HDL segments with the HDL blocks from which the HLD segments were generated.

HDL segment 415 represents the portion of HDL generated by the system corresponding to HLMS block 320. As discussed with reference to FIG. 3, HLMS block 320 can be assigned UCE 385 using one or more selected UCE association techniques. Accordingly, within HDL segment 415, the system inserts the content from UCE 385 in the form of a comment.

HDL segment 420 represents the portion of HDL generated by the system corresponding to HLMS block 340. As discussed with reference to FIG. 3, HLMS block 340 can be assigned UCE 390 using one or more selected UCE association techniques. Accordingly, within HDL segment 420, the system inserts the content from UCE 390 in the form of a comment.

HDL segment 425 represents the portion of HDL generated by the system corresponding to HLMS block 350. As discussed with reference to FIG. 3, HLMS block 350 can be assigned UCE 390 using one or more selected UCE association techniques. Accordingly, within HDL segment 425, the system inserts the content from UCE 390 in the form of a comment. As noted, in some cases a same UCE, e.g., UCE 390, can be assigned to more than one HLMS block and thus, more than one segment of HDL, e.g., HDL segments 420 and 425. A more detailed example of HLD segment 425 comprising content from UCE 390 is illustrated in block 450.

Figure 5:
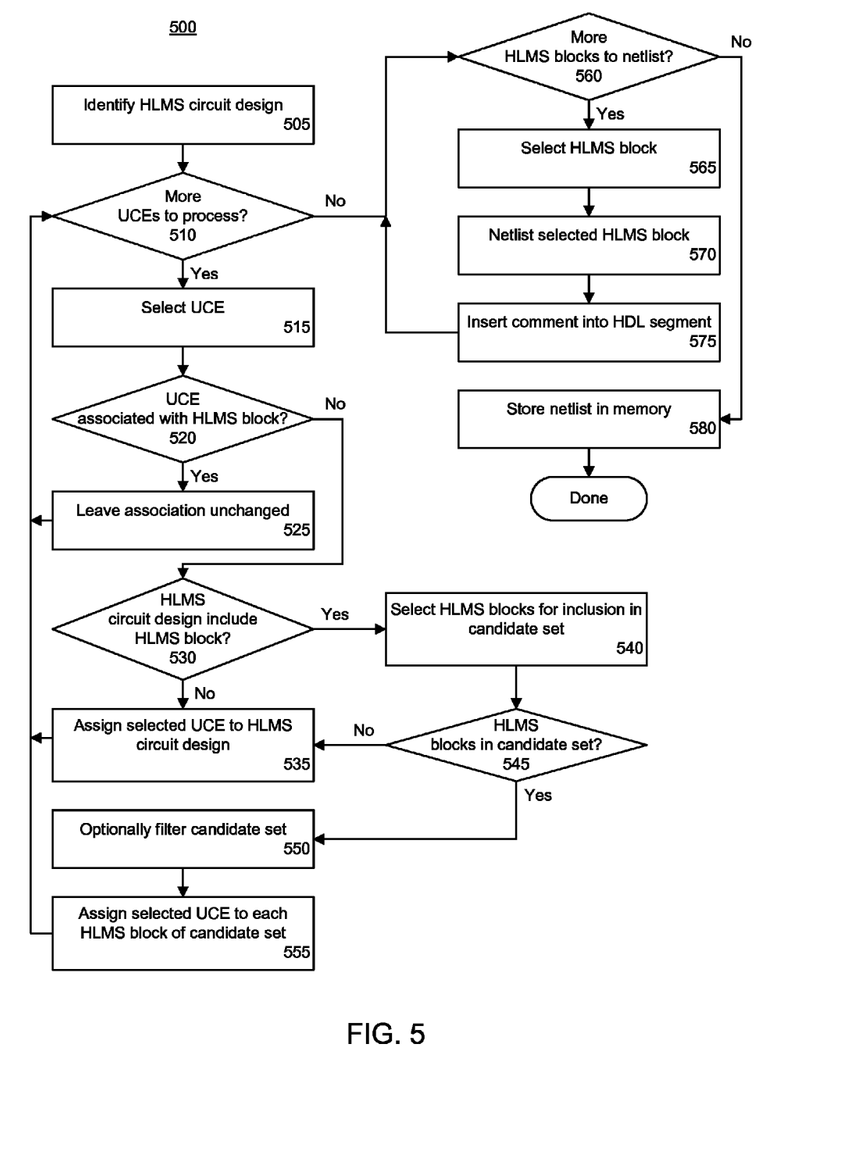
FIG. 5 is a flow chart illustrating a method of documenting a circuit design in accordance with another embodiment of the present invention.

FIG. 5 is a flow chart illustrating a method 500 of documenting a circuit design in accordance with another embodiment of the present invention. Method 500 can be implemented by a system as described with reference to FIGS. 1-4 of this specification. It should be appreciated that within method 500, when an element is determined, generated, selected, assigned, output, or the like, that the system, in performing that step, also stores the element within memory.

Accordingly, in step 505, the system can identify an HLMS circuit design. For example, an HLMS circuit design can be created with the design environment provided by the system or can be loaded into such an environment. In either case, the HLMS circuit design can comprise one or more UCEs of the variety described within this specification.

In step 510, the system can determine whether the HLMS circuit design includes any UCEs that have not yet been processed. When one or more UCEs of the circuit design remain to be processed, method 500 can proceed to step 515. When no more UCEs remain to be processed, e.g., each UCE has been processed using method 500, method 500 can continue to step 560 to begin netlisting the HLMS circuit design.

In step 515, the system can select a UCE for processing. In step 520, the system can determine whether the selected UCE is associated with, e.g., assigned to, an HLMS block. If so, method 500 can proceed to step 525, where the association, or assignment, is left unchanged. For example, when the selected UCE is a block name or a tag type of UCE, such UCEs are already assigned to a particular HLMS block and need not be assigned to other HLMS blocks. Thus, when the selected UCE is a block name or a tag type of UCE, method 500 proceeds to step 525. After step 525, method 500 loops back to step 510 to continue processing. It should be appreciated that in another embodiment, UCEs can be sorted according to type. In that case, only the block type of UCEs can be processed through FIG. 5, at which point steps 520 and 525 would be omitted.

When the selected UCE is not assigned to an HLMS block, as in the case of a text block type of UCE, method 500 can proceed to step 530. In step 530, the system can determine whether the HLMS circuit design, e.g., an HLMS subsystem, includes an HLMS block. If so, method 500 can continue to step 540. If not, method 500 can proceed to step 535. In step 535, the system can assign the selected UCE to the HLMS circuit design. Thus, when the HLMS circuit design does not include any HLMS blocks to which the selected UCE can be assigned, the selected UCE is assigned to the HLMS circuit design in general, e.g., the entire subsystem.

Continuing with step 540, where the system determines that the HLMS circuit design does include at least one HLMS block, the system can select a candidate set of HLMS blocks according to a selected UCE association technique. In one embodiment, each HLMS block that is located a predetermined distance from the selected UCE can be added or included within the candidate set. Distance can be determined in terms of the displayed, e.g., graphical, depiction of the HLMS circuit design as displayed or presented upon a display of the system. In another embodiment, each HLMS block that has a block name included within the text or content of the selected UCE can be added to the candidate set.

In step 545, the system can determine whether the candidate set comprises any HLMS blocks. If not, e.g., the candidate set includes no HLMS blocks, method 500 can continue to step 535, where the UCE is assigned to the HLMS circuit design as a whole, e.g., the entire subsystem. When the candidate set does include at least one HLMS block, method 500 can continue to step 550.

In step 550, the system can optionally filter the candidate set. One or more HLMS blocks, for example, can be removed from the candidate set that do not conform with the filtering criteria applied. In one embodiment, a different UCE association technique than was applied in step 540 can be applied in step 550. Thus, if distance was used to determine the candidate set, context can be used to filter the candidate set in step 550. In illustration, of the HLMS blocks of the candidate set that were located within a predetermine distance of the selected UCE, those HLMS blocks that do not have a block name that is included within the selected UCE can be removed from the candidate set. Non-conforming HLMS blocks, identified according to the context-based UCE association technique, can be removed from the candidate set.

Alternatively, when context is used to define the candidate set, distance can be used to filter. For example, when the candidate set includes a plurality of HLMS blocks that each have a block name specified within the UCE, in one embodiment, each HLMS block that is not within a predetermine distance of the selected UCE can be removed from the candidate set. Here again, non-conforming HLMS blocks, identified according to the distance-based UCE association technique, can be removed from the candidate set.

In any case, filtering step 550 is optional in nature. Further, it should be appreciated that filtering can be selectively applied. For example, filtering can be skipped when the candidate set includes only a single HLMS block. In another example, filtering may be applied when the candidate set includes a minimum number "N" of HLMS blocks, where N is an integer greater than zero. In illustration, filtering can be applied when N is greater than or equal to two, three, four, etc.

In step 555, the system can associate the selected UCE with each HLMS block of the candidate set. After step 555, method 500 can loop back to step 510 to continue processing.

Proceeding to step 560, when no further UCEs remain to be processed, the system can determine whether there are any HLMS block, or further HLMS blocks to be netlisted. If so, method 500 can proceed to step 565. If not, method 500 can continue to step 580. In step 565, the system can select an HLMS block to be netlisted. In step 570, the system can netlist the selected HLMS block. The system translates the HLMS block into a corresponding HDL segment as illustrated in FIG. 4. Each HDL segment that is generated effectively implements, e.g., specifies, hardware that corresponds to the HLMS block being netlisted. In step 575, within the HDL segment generated for the selected HLMS block, the system inserts the content of any UCEs that are associated with the selected HLMS block in the form of comment(s). As noted, content of UCEs is incorporated into HLD segments in the form of comments that are not compiled into hardware.

In one embodiment, content of UCEs can be incorporated into the HDL entity or HLD module generated for the HLMS block being netlisted. Those skilled in the art will appreciate that whether the content of a UCE is incorporated into an entity or a module as comments will depend upon the particular type of HDL that is used to netlist the HLMS circuit design. In another embodiment, content of UCEs can be incorporated into each instance specified in HDL for the HLMS blocks. A setting, for example, within the system can be specified by a user, according to preference, that causes the system to incorporate content of UCEs into entities (modules) or instances.

In step 580, the resulting netlist, in reference to the HDL formatted circuit design inclusive of comments derived from UCEs in the HLMS circuit design, can be stored in memory or otherwise output.

Figure 6:
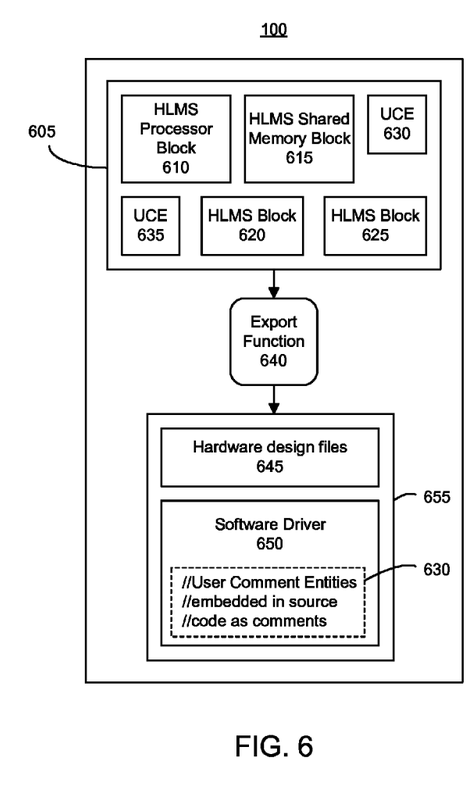
FIG. 6 is a fourth block diagram illustrating the system of FIG. 1 in accordance with another embodiment of the present invention.

FIG. 6 is a fourth block diagram illustrating the system of FIG. 1 in accordance with another embodiment of the present invention. For purposes of illustration, different aspects of system 100, e.g., the physical memory, processor, and system bus, have been excluded. FIG. 6 illustrates the case where system 100 is used to design a circuit that is a peripheral device interacting with an embedded processor. Within system 100, to aid in the design of the peripheral, the processor that is to interact with the peripheral being developed as HLMS circuit design 605 can be emulated using an HLMS processor block 610. In describing FIG. 6, it should be appreciated that any subsequent reference to a "processor" refers to the processor that is to communicate with, e.g., is part of, the circuit being developed within system 100, e.g., an embedded processor, and not to any processor that is part of system 100 executing the HLMS. HLMS processor block 610 allows a user-specified circuit, comprised of HLMS blocks 620 and 625 in this example, developed in system 100 to be attached to embedded processor systems.

The circuit designer can insert one or more HLMS shared memory blocks, e.g., HLMS shared memory block 615, into HLMS circuit design 605. HLMS shared memory block 615 is coupled to the user-specified circuit, e.g., HLMS block 620 and/or HLMS block 625. HLMS shared memory blocks can represent any of a variety of different memories. For example, HLMS shared memory block 615 can be one or more shared registers, one or more shared first-in-first-out memories, one or more block random access memories, or the like. HLMS shared memory blocks are inserted into HLMS circuit design 605 by the circuit designer to facilitate communication between the user-specified circuit and HLMS processor block 610. In this regard, the circuit designer can designate HLMS shared memory block 615 for this purpose. For example, the circuit designer can designate an HLMS shared memory for use in communicating with an embedded processor represented by HLMS processor block by assigning an attribute to the pertinent HLMS block.

In one embodiment, inclusion of HLMS processor block 610 within HLMS circuit design 605 causes system 100 to automatically generate a memory map interface that couples HLMS processor block 610 to HLMS shared memory block 615 within HLMS circuit design 605. Any of a variety of different interface mechanisms can be used, for example, slave PLB v4.6 interface, a pair of Fast Simplex Links, etc. User-specified circuitry in the form of HLMS blocks 620 and/or 625 can communicate with HLMS processor block 610 via the memory map interface that is automatically generated to couple HLMS shared memory block 615 with HLMS processor block 610.

An export function 640 of system 100 can process HLMS circuit design 605 and generate one or more hardware design files 645, e.g., HDL, as well as a software driver 650. In one embodiment, hardware design files 645 and software driver 650 can be output as a package 655, sometimes referred to as a "pcore," though this need not be the case. The hardware design files can specify the user-specified circuit, e.g., the peripheral; the peripheral and processor; the peripheral, processor, and memory map interface; or any combination of the peripheral, processor, and memory map interface according to user preference. Software driver 650 can be source code that, when compiled, is executed by the embedded processor and enables the embedded processor to access the shared memories specified, or represented, by HLMS shared memory block 615 within the hardware implementation of the memory map interface. Software driver 650, for example, allows the embedded processor to access shared memories by the names or locations of the shared memories on the memory map interface.

As described, HLMS memory blocks can be netlisted with UCEs, such as UCEs 630 and 635, being handled as described within this specification. In another embodiment, when a UCE, e.g., UCE 630, is assigned to HLMS shared memory block 615, e.g., a shared memory block within the HLMS circuit design intended to couple to the memory map interface, UCE 630 can be processed differently. It should be appreciated that UCE 630, or any other UCEs, can be assigned to HLMS shared memory block 615 in the manner described within this specification. For example, UCE 630 can be tag type of UCE that is assigned to HLMS shared memory block 615 by the circuit designer. Alternatively, UCE 630 can be assigned to HLMS shared memory block 615 using any of the UCE association techniques, or combinations thereof, described within this specification.

Thus, rather than include the content of UCE 630 within HDL code that is generated to specify HLMS shared memory block 615, the content of UCE 630 can be included as one or more comments within software driver 650 as shown. Software driver 650 can be specified in source code formatted in a selected high level programming language. The comments comprising the content of UCE 630 within software driver 650 are not compiled by a compiler into executable program code. In one aspect, while a single UCE can be assigned to multiple HLMS blocks, when the UCE is assigned to an HLMS shared memory block, that UCE can be precluded from being assigned to any other HLMS block.

In another aspect, software driver 650 can be a template specified in a high level programming language in the form of source code that is automatically generated by system 100. A software developer can use the template and insert, or develop, further programming code as may be desired or required. The software developer, using software driver 650 as a template, has the benefit of explanatory text, now in the form of comments. The comments are helpful in that the explanatory text of the comments is derived from UCEs placed into HLMS circuit design 605 by the circuit designer to describe how the user-specified circuit is intended to interface with the embedded processor via the memory map interface. This information can be useful in coding functionality, or additional functionality, of software driver 650, particularly as different individuals typically are responsible for developing software driver 650 and the hardware environment within which software driver 650 executes.

When a plurality of HLMS shared memory blocks are specified, where each is coupled to the memory map interface automatically created by system 100, software driver 650 can include a plurality of modules or functions, wherein each such module or function corresponds to a particular HLMS shared memory block. Accordingly, the content of each UCE that is assigned to each respective HLMS shared memory block can be included as a comment within the module or function of software driver 650 corresponding to that HLMS shared memory block.

In another embodiment, the comment(s) inserted into the source code of the software driver 650 can be formatted in a particular way. For example, additional identifiers and/or other symbols can be included to distinguish comments generated from UCEs of HLMS circuit design 605 from other comments that may be inserted by a software developer into software driver 650. Further, the formatting of the comments inserted into software driver 650, whether derived from UCEs or manually included, also can be formatted so that a documentation tool that processes source code can identify such comments and include the comments in an automatically generated application programming interface (API) document that provides description of the functionality and use of software driver 650. The API document can be a text document that includes extracted comments without, e.g., exclusive of, the source code of software driver 650.

The embodiments disclosed within this specification provide methods, systems, and apparatus for automatically documenting a circuit design. UCEs that are specified within an HLMS circuit design can be incorporated into the HDL that is generated and/or the software driver that is generated by the system from the HLMS circuit design. Inclusion of the content of the UCEs facilitates better understanding and documentation of the entire system design.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

Embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out the methods described herein is suited.

Embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. Within a system comprising a processor and a memory, a method of automatically documenting a circuit design, the method comprising:
   determining an assignment of a user comment entity of a high level modeling system (HLMS) circuit design to an HLMS block of the HLMS circuit design;
   wherein the user comment entity specifies explanatory text that is not transformable into hardware, each HLMS block of the HLMS circuit design represents a particular circuit function, and the HLMS circuit design includes signal flows between HLMS blocks;
   translating each HLMS block and the signal flows of the HLMS circuit design into a hardware description language representation of the particular circuit function of the HLMS block;
   for the HLMS block assigned the user comment entity, inserting within the hardware description language representation, by the processor, text of the user comment entity that is assigned to the HLMS block as a hardware description language comment; and
   storing, within the memory, the hardware description language representations of the HLMS blocks.

2. The method of claim 1, further comprising assigning the user comment entity to each HLMS block within a predetermined distance of the user comment entity as determined from a visualization of the HLMS circuit design.

3. The method of claim 1, further comprising assigning the user comment entity to each HLMS block having a block name matching a portion of text of the user comment entity.

4. The method of claim 1, wherein determining an assignment comprises:
   for the user comment entity, determining a candidate set comprising each HLMS block within a predetermined distance of the user comment entity as determined from a visualization of the HLMS circuit design;
   removing each HLMS block from the candidate set that does not have a block name matching a portion of text of the user comment entity; and
   assigning the user comment entity to each HLMS block of the candidate set.

5. The method of claim 1, wherein determining an assignment comprises:
   for the user comment entity, determining a candidate set comprising each HLMS block having a block name matching a portion of text of the user comment entity;
   removing each HLMS block from the candidate set that is not within a predetermined distance of the user comment entity as determined from a visualization of the HLMS circuit design; and
   assigning the user comment entity to each HLMS block of the candidate set.

6. The method of claim 1, wherein determining an assignment comprises assigning the user comment entity to the HLMS block responsive to a received user input indicating that the user comment entity is assigned to the HLMS block.

7. The method of claim 1, further comprising:
determining an assignment of a selected user comment entity of the HLMS circuit design to an HLMS shared memory block of the HLMS circuit design;
generating source code specifying a software driver that is executable by an embedded processor configured to communicate with a circuit specified by the hardware description language representations of the HLMS blocks; and
inserting, within the source code, content of the selected user comment entity of the HLMS circuit design in the form of at least one comment.

8. Within a system comprising a processor and a memory, a method of automatically documenting a circuit design, the method comprising:
determining an assignment of a user comment entity of a high level modeling system (HLMS) circuit design to an HLMS shared memory block of the HLMS circuit design;
wherein the user comment entity specifies explanatory text that is not compilable into executable program code;
generating, by the processor, source code specifying a software driver that is executable by an embedded processor configured to communicate with a circuit specified by the HLMS circuit design;
inserting, by the processor, text of the user comment entity assigned to the HLMS shared memory block within the source code as a comment; and
storing, within the memory, the software driver comprising the comment.

9. The method of claim 8, wherein determining an assignment comprises assigning the user comment entity to the HLMS shared memory block responsive to a received user input indicating that the user comment entity is assigned to the HLMS shared memory block.

10. The method of claim 8, further comprising assigning each user comment entity within a predetermined distance of the HLMS shared memory block to the HLMS shared memory block as determined from a visualization of the HLMS circuit design.

11. The method of claim 8, further comprising assigning each user comment entity comprising text matching a block name of the HLMS shared memory block to the HLMS shared memory block.

12. The method of claim 8, wherein determining an assignment comprises assigning the user comment entity to only the HLMS shared memory block and to no other HLMS block.

13. The method of claim 8, further comprising automatically generating documentation for the software driver by extracting at least a portion of the comments from the software driver and inserting the extracted comments within a documentation file exclusive of the source code.

14. The method of claim 8, further comprising:
determining an assignment of at least one additional user comment entity of the HLMS circuit design to an HLMS block of the HLMS circuit design;
wherein the user comment entity includes explanatory text that is not transformable into hardware, each HLMS block of the HLMS circuit design represents a particular circuit function, and the HLMS circuit design includes signal flows between HLMS blocks;
translating each HLMS block and the signal flows of the HLMS circuit design into a hardware description language representation of the particular circuit function of the HLMS block; and
for the HLMS block assigned the additional user comment entity, inserting within the hardware description language representation, by the processor, content of the additional user comment entity associated with the HLMS block in the form of a comment.

15. A device, comprising:
a data storage medium usable by a system comprising a processor and a memory, wherein the data storage medium stores program code that, when executed by the system, causes the system to execute operations comprising:
determining an assignment of a user comment entity of a high level modeling system (HLMS) circuit design to an HLMS block of the HLMS circuit design;
wherein the user comment entity specifies explanatory text that is not transformable into hardware, each HLMS block of the HLMS circuit design represents a particular circuit function, and the HLMS circuit design includes signal flows between HLMS blocks;
translating each HLMS block and the signal flows of the HLMS circuit design into a hardware description language representation of the particular circuit function of the HLMS block;
for the HLMS block assigned the user comment entity, inserting within the hardware description language representation, by the processor, text of the user comment entity that is assigned to the HLMS block as a hardware description language comment; and
storing, within the memory, the hardware description language representations of the HLMS blocks.

16. The device of claim 15, further comprising assigning the user comment entity to each HLMS block within a predetermined distance of the user comment entity as determined from a visualization of the HLMS circuit design.

17. The device of claim 15, further comprising assigning the user comment entity to each HLMS block having a block name matching a portion of text of the user comment entity.

18. The device of claim 15, wherein determining an assignment comprises:
for the user comment entity, determining a candidate set comprising each HLMS block determined according to a first user comment entity association technique;
removing each HLMS block from the candidate set identified according to a second user comment entity association technique; and
assigning the user comment entity to each HLMS block of the candidate set.

19. The device of claim 15, wherein determining an assignment comprises assigning the user comment entity to the HLMS block responsive to a received user input indicating that the user comment entity is assigned to the HLMS block.

20. The device of claim 15, wherein the data storage medium further stores program code that, when executed by the system, causes the system to execute operations comprising:
determining an assignment of a selected user comment entity of the HLMS circuit design to an HLMS shared memory block of the HLMS circuit design;
generating source code specifying a software driver that is executable by an embedded processor configured to communicate with a circuit specified by the hardware description language representations of the HLMS blocks; and
inserting, within the source code, content of the selected user comment entity of the HLMS circuit design in the form of at least one comment.

* * * * *